United States Patent
Chun et al.

(10) Patent No.: US 10,707,969 B1
(45) Date of Patent: Jul. 7, 2020

(54) CONTROLLER OF OPTICAL TRANSMITTER

(71) Applicant: Samsung Electro-Mechanics Co., Ltd., Suwon-si (KR)

(72) Inventors: Ji Buem Chun, Suwon-si (KR); Sung Man Pang, Suwon-si (KR); Je Hyeon Yu, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/519,918

(22) Filed: Jul. 23, 2019

(30) Foreign Application Priority Data

Mar. 18, 2019 (KR) .......................... 10-2019-0030623

(51) Int. Cl.
*H04B 10/50* (2013.01)
*H04B 10/564* (2013.01)
*H01S 5/042* (2006.01)

(52) U.S. Cl.
CPC ......... *H04B 10/564* (2013.01); *H01S 5/0427* (2013.01); *H04B 10/504* (2013.01)

(58) Field of Classification Search
CPC ....... H04B 10/506; H04B 10/516; H01S 3/00; H01S 3/10
See application file for complete search history.

(56) References Cited

U.S. PATENT DOCUMENTS

| 2006/0126683 A1* | 6/2006 | Kang ...................... H01S 5/042 372/38.02 |
| 2008/0310851 A1* | 12/2008 | Ichino .................... H04B 10/40 398/135 |
| 2010/0322271 A1* | 12/2010 | Ichino ................. H01S 5/06804 372/26 |
| 2015/0030339 A1* | 1/2015 | Margalit .............. H04B 10/516 398/183 |
| 2016/0268981 A1* | 9/2016 | Jiang ...................... H03F 1/083 |

FOREIGN PATENT DOCUMENTS

| KR | 10-2006-0067046 A | 6/2006 |
| KR | 10-0621216 B1 | 9/2006 |
| KR | 10-0884484 B1 | 2/2009 |

* cited by examiner

*Primary Examiner* — Dzung D Tran
(74) *Attorney, Agent, or Firm* — NSIP Law

(57) ABSTRACT

A controller includes an amplification ratio control unit, an amplification unit, a digital conversion unit, and a driving current control unit. The amplification ratio control unit is configured to generate an amplification ratio signal based on an ambient temperature of a laser diode. The amplification unit configured to amplify, based on the amplification ratio signal, a detection current from a photodiode configured to detect light output from the laser diode, and output the detection current as a voltage signal. The amplification ratio signal controls an amplification ratio of the amplification unit. The digital conversion unit is configured to convert the voltage signal into a digital signal. The driving current control unit is configured to control a driving current of a driver configured to drive the laser diode based on the digital signal.

16 Claims, 3 Drawing Sheets

CONTROLLER OF OPTICAL TRANSMITTER

CROSS-REFERENCE TO RELATED APPLICATION(S)

This application claims benefit under 35 USC 119(a) of Korean Patent Application No. 10-2019-0030623 filed on Mar. 18, 2019 in the Korean Intellectual Property Office, the entire disclosure of which is incorporated herein by reference for all purposes.

BACKGROUND

1. Field

The following description relates to a controller of an optical transmitter.

2. Description of Related Art

In general, in a semiconductor laser diode used as an optical transmitting element, the threshold current (Ith) increases as the ambient temperature rises, and the slope of the current-optical output curve decreases. Therefore, an extinction ratio, defined as a ratio of optical power corresponding to a '1' level and a '0' level digitally decreases, as the temperature rises, and transmission efficiency decreases.

In an example of a transmission module for optical communications used in an optical network, since an extinction ratio is 8 dB to 10 dB or more in an international electrical telecommunications standard, the standard cannot be satisfied within a specific temperature range due to temperature characteristics of a semiconductor laser diode. Therefore, it is desirable that an output power of the laser diode corresponding to the '1' level and that the '0' level is fixed, digitally.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a controller includes an amplification ratio control unit, an amplification unit, a digital conversion unit, and a driving current control unit. The amplification ratio control unit is configured to generate an amplification ratio signal based on an ambient temperature of a laser diode. The amplification unit configured to amplify, based on the amplification ratio signal, a detection current from a photodiode configured to detect light output from the laser diode, and output the detection current as a voltage signal. The amplification ratio signal controls an amplification ratio of the amplification unit. The digital conversion unit is configured to convert the voltage signal into a digital signal. The driving current control unit is configured to control a driving current of a driver configured to drive the laser diode based on the digital signal.

The amplification unit may include an amplifier and a resistor connected in parallel to the amplifier.

The photodiode may be a monitoring photodiode, the amplifier may be a transimpedance amplifier and the resistor may be a variable resistor.

The variable resistor may be varied based on the ambient temperature of the laser diode.

The amplification ratio control unit may include a temperature sensor configured to detect the ambient temperature of the laser diode, a memory storing data relating to resistance values of the variable resistor corresponding to temperature values, and a resistance value determination unit configured to determine the resistance values of the variable resistor based on a temperature of the temperature sensor, using the stored data.

The temperature sensor may include a thermistor.

The digital conversion unit may include an analog-to-digital converter configured to convert the voltage signal into a digital signal, and an offset removal unit configured to differentiate a digital signal corresponding to a default current of the photodiode in the digital signal from the analog-to-digital converter.

The default current may correspond to a current output from the photodiode in a dark-field environment or by ambient light.

The driving current control unit may include a bias current control unit and a modulation current control unit configured to control a bias current and a modulation current of the driving current of the driver, respectively.

In another general aspect, a controller includes a reference current providing unit, an amplification ratio control unit, an amplification unit, a digital conversion unit, and a driving current control unit. The reference current providing unit is configured to generate a reference current. The amplification ratio control unit is configured to generate an amplification ratio signal based on an ambient temperature of a laser diode and a level of the reference current. The amplification unit is configured to amplify a detection current from a photodiode configured to detect light output from the laser diode and the reference current, and output the detection current and the reference current as a voltage signal. The amplification ratio control unit controls an amplification ratio of the amplification unit. The digital conversion unit is configured to convert the voltage signal into a digital signal. The driving current control unit is configured to control a driving current of a driver configured to drive the laser diode according to the digital signal.

The amplification unit may include an amplifier and a resistor connected in parallel to the amplifier.

The photodiode may be a monitoring photodiode, the amplifier may be a transimpedance amplifier and the resistor may be a variable resistor.

The variable resistor may be varied based on the reference value and the ambient temperature of the laser diode.

The amplification ratio control unit may include a temperature sensor configured to detect the ambient temperature of the laser diode, a memory storing resistance values of the variable resistor corresponding to temperature values, and a resistance value determination unit configured to determine the resistance values of the variable resistor based on the level of the reference current and a temperature of the temperature sensor, using the stored data.

The temperature sensor may include a thermistor.

The digital conversion unit may include an analog-to-digital converter configured to convert the voltage signal into a digital signal, and an offset removal unit configured to differentiate a digital signal corresponding to a default current of the photodiode in the digital signal from the analog-to-digital converter.

The default current may correspond to a current output from the photodiode in a dark-field environment or by ambient light.

The driving current control unit may include a bias current control unit and a modulation current control unit, configured to control each of a bias current and a modulation current of the driving current of the driver, respectively.

In another general aspect, a transmitter includes a monitoring photo diode, a controller, a digital conversion unit, and a driver. The monitoring photo diode is configured to detect light output from a laser diode and generate a detection current. The controller includes an amplification ratio control unit and an amplification unit. The amplification ratio control unit is configured to generate an amplification ratio signal based on an ambient temperature of the laser diode. The amplification unit is configured to amplify, based on the amplification ratio signal, the detection current, and output the detection current as a voltage signal, wherein the amplification ratio signal controls an amplification ratio of the amplification unit. The digital conversion unit is configured to convert the voltage signal into a digital signal. The driver is configured to drive the laser diode based on the digital signal.

The amplification unit may include an amplifier and a resistor connected in parallel to the amplifier, the photodiode may be a monitoring photodiode, and the amplifier may be a transimpedance amplifier.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
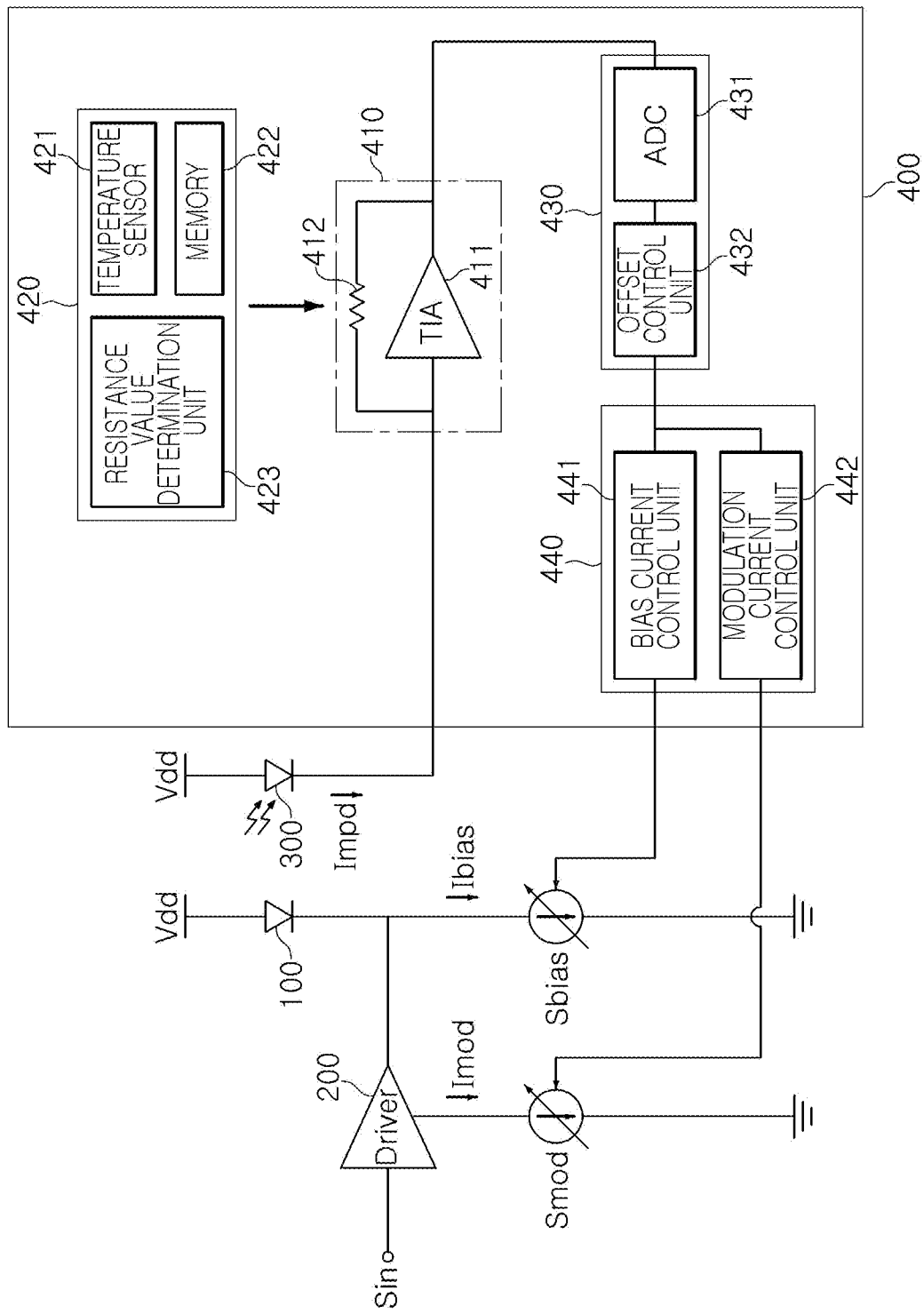
FIG. 1 is a view illustrating an example of an optical transmitter.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view illustrating an example of an optical transmitter.

Referring to FIG. 1, an optical transmitter according to an embodiment of the present disclosure may include a laser diode (LD) 100, a driver 200, a monitoring photodiode 300, and a controller 400.

The laser diode 100 may output light based on being driven by the driver 200. For example, the laser diode 100 may include a vertical-cavity-surface-emitting laser (VCSEL).

The driver 200 may drive the laser diode 100 based on an input signal (Sin). The driver 200 may supply a driving current to the laser diode 100 to drive the laser diode 100. The driving current may include a bias current (Ibias) and a modulation current (Imod).

As an example, the driver 200 may switch the modulation current (Imod) based on the input signal (Sin), provide the bias current (Ibias) and the modulation current (Imod) to the laser diode 100 in a first section, and provide the bias current (Ibias) to the laser diode 100 in a second section. The first section and the second section may be alternately repeated.

The monitoring photodiode (MPD) 300 may detect light output from the laser diode 100. The monitoring photodiode 300 may detect the light output from the laser diode 100 to generate the detection current (Impd).

The controller 400 may control the driver 200 by varying the bias current (Ibias) and the modulation current (Imod), based on the detection current (Impd).

The controller 400, in an example, may include an amplification unit 410, an amplification ratio control unit 420, a digital conversion unit 430, and a driving current control unit 440.

The amplification unit 410 may amplify the detection current (Impd) provided by the monitoring photodiode 300 and output the detection current (Impd) as a voltage signal. The amplification unit 410 may include a transimpedance amplifier (TIA) 411 and an amplification resistor 412 disposed between an input terminal and an output terminal of the transimpedance amplifier (TIA) 411.

For example, the transimpedance amplifier (TIA) 411 and the amplification resistor 412 may be connected in a form of an inverter inverting a phase of the detection current (Impd) by 180 degrees, and in the example, the phase of the input signal may be connected to output the phase of the input signal as an in-phase without inversion.

The amplification ratio of the amplification unit 410 is determined by a resistance value of the amplification resistor 412. The amplification resistor 412, in an example, may include or be a variable resistor in which the resistance value is varied.

Figure 2:
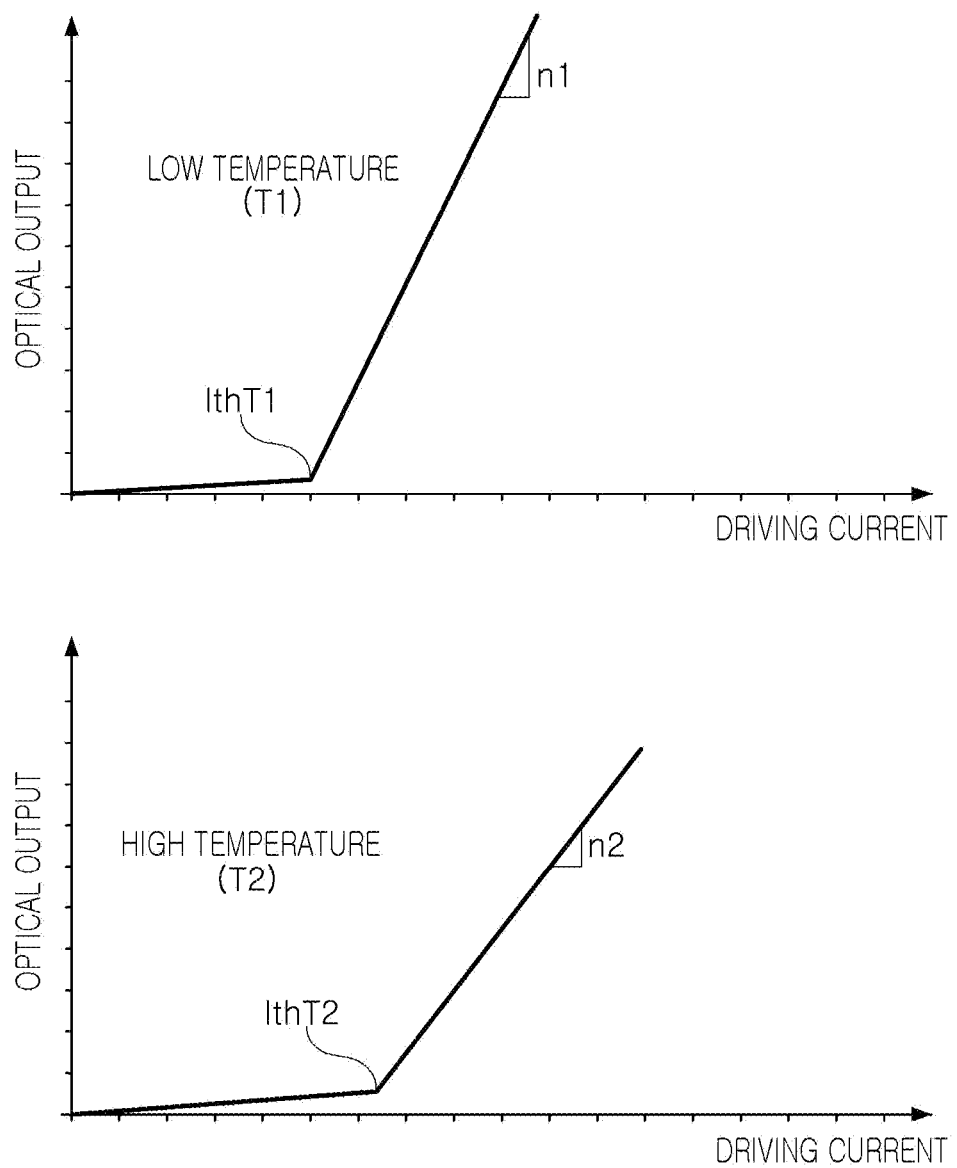
FIG. 2 is a characteristic graph of an example of a laser diode illustrating an optical output with respect to a driving current.

FIG. 2 is a characteristic graph of an example of a laser diode illustrating an optical output with respect to a driving current.

In a laser diode used as an optical transmitting element, as ambient temperature rises from a low temperature T1 to a high temperature T2, the threshold current (IthT1<IthT2) increases. In addition, in the laser diode, the slope (n1>n2) of an optical output curve with respect to a driving current decreases as ambient temperature rises from the low temperature T1 to the high temperature T2. That is, the higher the temperature, the lower the transmission efficiency of the laser diode.

Therefore, in order for the optical transmitter to stably maintain the output, it may be desirable to control the driving current of the laser diode. In particular, when the ambient temperature of the optical transmitter rises, it may be desirable to raise the driving current of the laser diode.

The amplification ratio control unit 420 may vary the resistance value of the amplification resistor 412 based on a temperature change.

The amplification ratio control unit 420 may include a temperature sensor 421, a memory 422, and a resistance value determination unit 423.

The temperature sensor 421 may detect the ambient temperature of the optical transmitter, for example, the ambient temperature of the laser diode. For example, temperature sensor 421 may include a thermistor.

The memory 422 may store data relating to resistance values of the amplification resistors 412 corresponding to a plurality of temperature values. The memory 422 may store data of a type in which high resistance values correspond to high temperature and low resistance values correspond to a low resistance temperature. As an example, the memory 422 may store the resistance values of the amplification resistors 412 corresponding to each of the plurality of temperature values in the form of a look-up table.

The resistance value determination unit 423 may use data relating to resistance values of the amplification resistors 412 that corresponds to each of the plurality of temperature values in the memory 422 to determine the resistance value of the amplification resistor 412, based on the current temperature provided by the temperature sensor 421, in an example. The amplification ratio of the amplification unit 410 may be determined based on the determined resistance value of the amplification resistor 412.

When the current temperature is higher than a reference temperature, the resistance value determination unit 423 may raise the amplification ratio by raising the resistance value of the amplification resistor 412, in a non-limiting example. When a current temperature is lower than the reference temperature, the resistance value determination unit 423 may lower the amplification ratio by lowering the resistance value of the amplification resistor 412, in a non-limiting example.

The digital conversion unit 430 may include an analog-to-digital converter 431 and an offset removal unit 432.

The analog-digital converter 431 may convert a voltage signal output from the amplification unit 410 to generate a digital signal corresponding to the detection unit.

In an example, the offset removal unit 432 may remove the offset by differentiating the digital signal corresponding to a default current in the digital signal of the detection current (Impd).

In this example, the default current is not a current output from the monitoring photodiode 300 in response to the light output from the laser diode 100, but a current output from the monitoring photodiode 300 in a dark-field environment or a current basically output from the monitoring photodiode 300 by ambient light. That is, since the default current is included in the detection current (Impd), it may be desirable to remove the default current included in the detection current (Impd).

The offset removal unit 432 may calculate a voltage signal corresponding to the default current by applying the amplification ratio of the amplification unit 410 to a predetermined default current, and may generate a digital signal corresponding to the default current from the calculated voltage signal.

According to an example of the present disclosure, in the digital signal corresponding to the detection current (Impd), by differentiating the digital signal corresponding to the default current, it may be possible to effectively detect only the current output from the monitoring photodiode 300 in response to the light output from the laser diode 100.

The driving current control unit 440 may control the driving current of the driver 200 based on the digital signal output from the digital conversion unit 430.

The driving current control unit 440 may include a bias current control unit 441 and a modulation current control unit 442.

The bias current control unit 441 may control a bias current source (Sbias) to control a bias current (Ibias) of the driver 200, and the modulation current control unit 442 may control a modulation current source (Smod) to control a modulation current (Imod) of the driver 200.

In an optical transmitter according to an example of the present disclosure, when ambient temperature of the laser diode of the optical transmitter rises, the output of the laser diode may be stably maintained by setting the amplification ratio of the detection current high.

Figure 3:
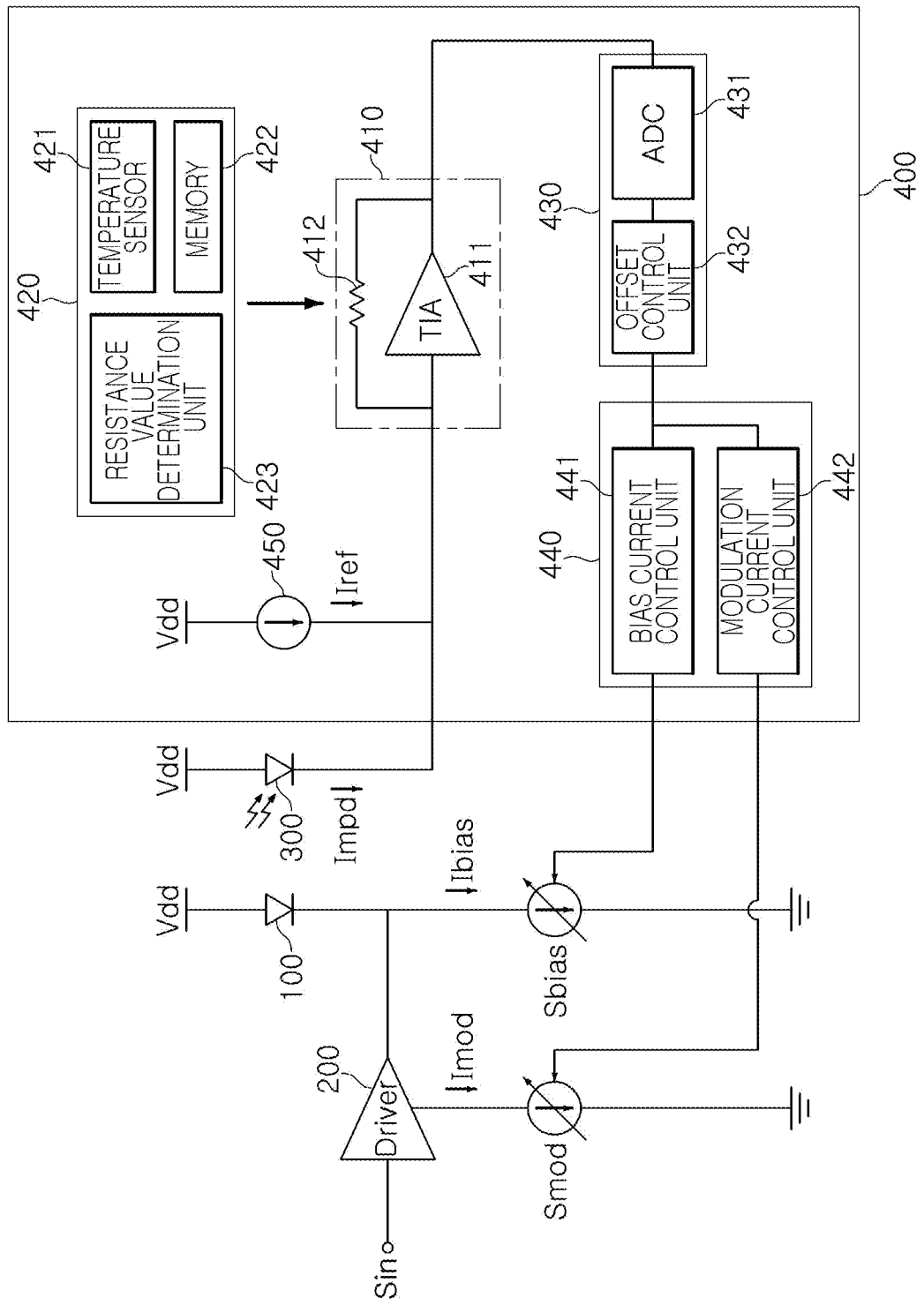
FIG. 3 is a view illustrating an example of an optical transmitter.

FIG. 3 is a view illustrating an example of an optical transmitter.

The optical transmitter, according to FIG. 3 is similar to that of the optical transmitter described in FIG. 1; thus, duplicated description will be omitted and differences will be mainly described.

Referring to FIGS. 1 and 3, the optical transmitter according to the example of FIG. 3 may further include a reference current providing unit 450 when compared with the optical transmitter described in FIG. 1.

The reference current providing unit 450 may generate a reference current (Iref), and provide the reference current (Iref) to the amplification unit 410. By the reference current (Iref) provided from the reference current providing unit 450, the detection current (Impd) and the reference current (Iref) may be input to the amplification unit 410.

In an example where the ambient temperature of the optical transmitter is relatively extremely high, when only the detection current (Impd) is input to the amplification unit 410 as in an embodiment of FIG. 1, in order to generate a high-level voltage signal, it may be desirable to vary the resistance value of the amplification resistor 412 extremely high.

However, in order to implement and change the resistance value from an extremely relatively low level to an extremely relatively high level, the amplification resistor 412 implemented with a variable resistor may require a large number of resistors, which may make it difficult to integrate the controller 400.

The optical transmitter according to an example of the present disclosure may provide the reference current (Iref) to the amplification unit 410 in addition to the detection current (Impd), such that even when a variable level of the amplification resistor 412 is low, a high-level voltage signal may be generated. Therefore, even when the driving current is raised based on the high-level voltage signal, and the ambient temperature of the laser diode of the optical transmitter rises, the output of the laser diode may be stably maintained.

During an automatic power control (APC), when the current level of the detection current (Impd) is less than a threshold level, a control error may occur due to the extremely low current level. According to an example of the present disclosure, it may be possible to remove the error at the APC by providing a reference current (Iref) in addition to the detection current (Impd).

The amplification ratio control unit 420 may vary the resistance value of the amplification resistor 412 based on the level and temperature change of the reference current (Iref).

The amplification ratio control unit 420 may include a temperature sensor 421, a memory 422, and a resistance value determination unit 423.

The temperature sensor 421 may detect an ambient temperature of the optical transmitter, specifically an ambient temperature of the laser diode. As an example, the temperature sensor 421 may include a thermistor.

The memory 422 may store data relating to the resistance values of the amplification resistors 412 corresponding to a plurality of temperature values. In an example, the memory 422 may store the resistance values of the amplification resistors 412 corresponding to each of the plurality of temperature values in the form of a look-up table.

The resistance value determination unit 423 may use data relating to the resistance values of the amplification resistors 412 corresponding to each of the plurality of temperature values in the memory 422 to determine the resistance value of the amplification resistor 412, based on the level of the reference current (Iref) and current temperature value provided from the temperature sensor 421. According to the determined resistance value of the amplification resistor 412, the amplification ratio of the amplification unit 410 may be determined.

The analog-to-digital converter 431 of the digital conversion unit 430 may convert the voltage signal output from the amplification unit 410 to generate a digital signal corresponding to the sum of the detection current (Impd) and the reference current (Iref).

The offset removal unit 432 may remove the offset by differentiating the digital signal corresponding to a sum of the reference current (Iref) and a default current in the digital signal corresponding to the sum of the detection current (Impd) and the reference current (Iref). Here, as described above, the default current is not a current output from the monitoring photodiode 300 in response to the light output from the laser diode 100, but a current output from the monitoring photodiode 300 in a dark-field situation or a current basically output from the monitoring photodiode 300 by the ambient light.

The offset removal unit 432 may apply the amplification ratio of the amplification unit 410 to a sum of the reference current (Iref) and the default current, determined in advance, and calculate a voltage signal corresponding to the sum of the reference current (Iref) and the default current, and may generate the digital signal corresponding to the sum of the reference current (Iref) and the default current from the calculated voltage signal.

According to an example of the present disclosure, in the digital signal corresponding to a sum of the detection current (Impd) and the reference current (Iref) by differentiating the digital signal corresponding to the sum of the reference current (Iref) and the default current, only the current output from the monitoring photodiode 300 may be effectively detected in response to the light output from the laser diode 100.

As set forth above, according to an embodiment of the present disclosure, an optical transmitter may be stably maintained by determining an amplification ratio amplifying a detection current of a monitoring photodiode, in response to a temperature change. In addition, according to an embodiment of the present disclosure, a controller of an optical transmitter may be integrated by lowering a resistance value of an amplification resistor amplifying the detection current.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A controller, comprising:
an amplification ratio control unit configured to generate an amplification ratio signal based on an ambient temperature of a laser diode;
an amplification unit configured to
amplify, based on the amplification ratio signal, a detection current from a photodiode configured to detect light output from the laser diode, and
output the detection current as a voltage signal, wherein the amplification ratio signal controls an amplification ratio of the amplification unit;
a digital conversion unit configured to convert the voltage signal into a digital signal; and
a driving current control unit configured to control a driving current of a driver configured to drive the laser diode based on the digital signal,
wherein the digital conversion unit comprises:
an analog-to-digital converter configured to convert the voltage signal into a digital signal; and
an offset removal unit configured to differentiate a digital signal corresponding to a default current of the photodiode in the digital signal from the analog-to-digital converter.

2. The controller of claim 1, wherein the amplification unit comprises an amplifier and a resistor connected in parallel to the amplifier.

3. The controller of claim 2, wherein the photodiode is a monitoring photodiode, the amplifier is a transimpedance amplifier and the resistor is a variable resistor.

4. The controller of claim 1, wherein the default current corresponds to a current output from the photodiode in a dark-field environment or by ambient light.

5. The controller of claim 1, wherein the driving current control unit comprises a bias current control unit and a modulation current control unit configured to control a bias current and a modulation current of the driving current of the driver, respectively.

6. A controller, comprising:
an amplification ratio control unit configured to generate an amplification ratio signal based on an ambient temperature of a laser diode;
an amplification unit configured to
amplify, based on the amplification ratio signal, a detection current from a photodiode configured to detect light output from the laser diode, and
output the detection current as a voltage signal, wherein the amplification ratio signal controls an amplification ratio of the amplification unit;
a digital conversion unit configured to convert the voltage signal into a digital signal; and
a driving current control unit configured to control a driving current of a driver configured to drive the laser diode based on the digital signal,
wherein the amplification unit comprises an amplifier and a resistor connected in parallel to the amplifier,
the photodiode is a monitoring photodiode, the amplifier is a transimpedance amplifier and the resistor is a variable resistor, and
the variable resistor is varied based on the ambient temperature of the laser diode.

7. The controller of claim 6, wherein the amplification ratio control unit comprises:
a temperature sensor configured to detect the ambient temperature of the laser diode;
a memory storing data relating to resistance values of the variable resistor corresponding to temperature values; and
a resistance value determination unit configured to determine the resistance values of the variable resistor based on a temperature of the temperature sensor, using the stored data.

8. The controller of claim 7, wherein the temperature sensor comprises a thermistor.

9. A controller comprising:
a reference current providing unit configured to generate a reference current;
an amplification ratio control unit configured to generate an amplification ratio signal based on an ambient temperature of a laser diode and a level of the reference current;
an amplification unit configured to
amplify a detection current from a photodiode configured to detect light output from the laser diode and the reference current, and
output the detection current and the reference current as a voltage signal, wherein the amplification ratio control unit controls an amplification ratio of the amplification unit;
a digital conversion unit configured to convert the voltage signal into a digital signal; and
a driving current control unit configured to control a driving current of a driver configured to drive the laser diode according to the digital signal,
wherein the digital conversion unit comprises:
an analog-to-digital converter configured to convert the voltage signal into a digital signal; and
an offset removal unit configured to differentiate a digital signal corresponding to a default current of the photodiode in the digital signal from the analog-to-digital converter.

10. The controller of claim 9, wherein the amplification unit comprises an amplifier and a resistor connected in parallel to the amplifier.

11. The controller of claim 10, wherein the photodiode is a monitoring photodiode, the amplifier is a transimpedance amplifier and the resistor is a variable resistor.

12. The controller of claim 11, wherein the amplification ratio control unit comprises a temperature sensor configured to detect the ambient temperature of the laser diode;
a memory storing resistance values of the variable resistor corresponding to temperature values; and
a resistance value determination unit configured to determine the resistance values of the variable resistor based on the level of the reference current and a temperature of the temperature sensor, using the stored data.

13. The controller of claim 12, wherein the temperature sensor comprises a thermistor.

14. The controller of claim 9, wherein the default current corresponds to a current output from the photodiode in a dark-field environment or by ambient light.

15. The controller of claim 9, wherein the driving current control unit comprises a bias current control unit and a modulation current control unit, configured to control each of a bias current and a modulation current of the driving current of the driver, respectively.

16. A controller, comprising:
- a reference current providing unit configured to generate a reference current;
- an amplification ratio control unit configured to generate an amplification ratio signal based on an ambient temperature of a laser diode and a level of the reference current;
- an amplification unit configured to
- amplify a detection current from a photodiode configured to detect light output from the laser diode and the reference current, and
- output the detection current and the reference current as a voltage signal, wherein the amplification ratio control unit controls an amplification ratio of the amplification unit;
- a digital conversion unit configured to convert the voltage signal into a digital signal; and
- a driving current control unit configured to control a driving current of a driver configured to drive the laser diode according to the digital signal,
- wherein the amplification unit comprises an amplifier and a resistor connected in parallel to the amplifier,
- the photodiode is a monitoring photodiode, the amplifier is a transimpedance amplifier and the resistor is a variable resistor, and
- the variable resistor is varied based on the reference value and the ambient temperature of the laser diode.

* * * * *